United States Patent
Tanabe et al.

(10) Patent No.: US 7,450,912 B2
(45) Date of Patent: Nov. 11, 2008

(54) TRANSMITTER AND TRANSCEIVER

(75) Inventors: Mitsuru Tanabe, Katano (JP); Koichiro Tanaka, Takarazuka (JP); Noriaki Saito, Machida (JP)

(73) Assignee: Panasonic Corporation, Osaka (JP)

( * ) Notice: Subject to any disclaimer, the term of this patent is extended or adjusted under 35 U.S.C. 154(b) by 497 days.

(21) Appl. No.: 11/073,860

(22) Filed: Mar. 8, 2005

(65) Prior Publication Data

US 2005/0202789 A1   Sep. 15, 2005

(30) Foreign Application Priority Data

Mar. 12, 2004   (JP) .............................. 2004-071150

(51) Int. Cl.
*H04B 1/04* (2006.01)
(52) U.S. Cl. .............. 455/114.3; 455/115.1; 455/127.3; 455/118
(58) Field of Classification Search .............. 455/71, 455/215, 118, 110, 76, 108, 84, 102, 127.2, 455/93, 82, 87, 112, 126, 127.5, 115.1, 127.3, 455/114.2–3; 330/149, 200, 199

See application file for complete search history.

(56) References Cited

U.S. PATENT DOCUMENTS 6,154,640 A * 11/2000 Itoh et al. ..................... 455/76
6,256,482 B1 * 7/2001 Raab .......................... 455/108
6,625,424 B1 * 9/2003 Mohindra .................... 455/84

* cited by examiner

*Primary Examiner*—John J Lee
(74) *Attorney, Agent, or Firm*—Dickinson Wright, PLLC (57) ABSTRACT g(x) Storing means stores a correction function y=g(x) corresponding to the distortion of a high frequency power amplifier as a function of a voltage x provided to a power supply terminal of the high frequency power amplifier. Operating means receives the correction function g(x) and a complex vector modulation signal z provided from modulation signal generating means, then causes an inverse function $g^{-1}$ to operate on the absolute value and the phase of the complex vector modulation signal z having undergone polar coordinate conversion, and thereby outputs $z'=g^{-1}(z)$. This data is provided to the high frequency power amplifier. Further, triangular wave storing means is provided for storing a triangular wave having the same amplitude as that of the modulation signal. Either the triangular wave signal outputted from the triangular wave storing means or the modulation signal z' is selectively provided to the high frequency power amplifier.

15 Claims, 8 Drawing Sheets

TRANSMITTER AND TRANSCEIVER

BACKGROUND OF THE INVENTION

1. Field of the Invention

The present invention relates to a radio transmitter and a radio transceiver for handling a modulated wave signal having an amplitude component, as well as a high frequency power amplifier used in the same.

2. Prior Art

In general, when a modulated wave signal having an amplitude component is amplified by a high frequency power amplifier, a signal up to a peak power needs to be amplified linearly. This requires a large DC power, and causes a waste of DC power by the amount of difference (back-off) of the peak power from the mean power.

For example, in a class A amplifier, its theoretical maximum efficiency is 50%. When the back-off is 7 dB, the mean power falls to as low as 20% of the peak power so that the efficiency falls to 10%.

In order to resolve such a problem, an EER (Envelope Elimination and Restoration) method known as the Kahn technique has been proposed in the prior art (for example, see U.S. Pat. No. 6,256,482B1(FIG. 6 at p. 3 of drawing sheets)).

Figure 8:
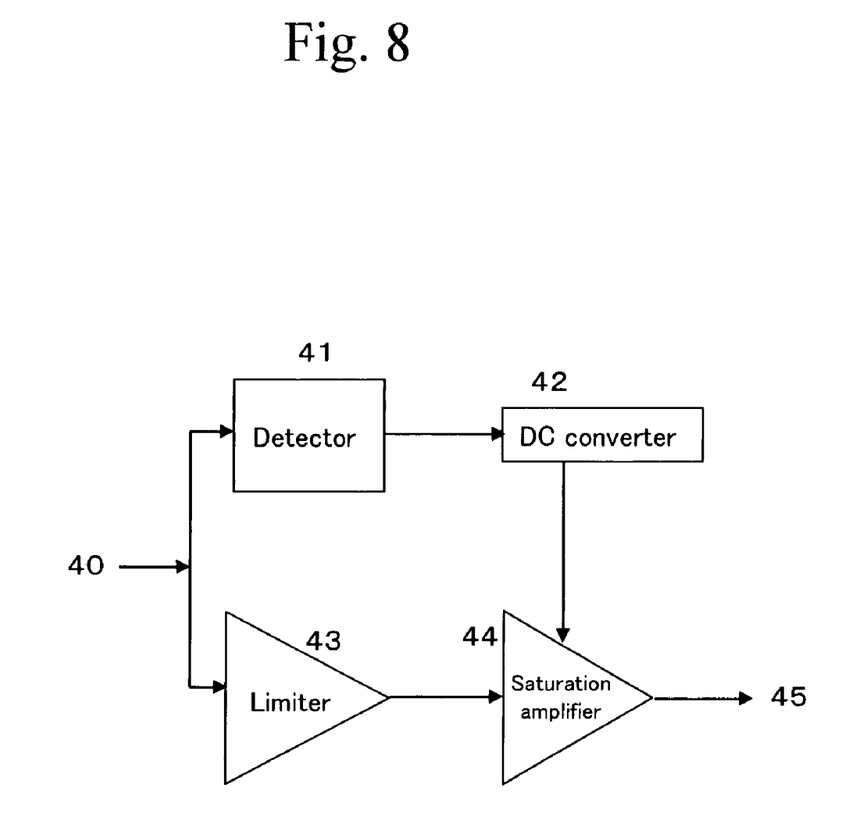
FIG. 8 is a block diagram showing the outline of an EER method.

FIG. 8 is a block diagram showing the outline of an EER method. In FIG. 8, a modulated wave inputted to an input terminal 40 is branched. In one branch, a detector 41 performs envelope detection on the modulated wave so as to generate an amplitude component. A DC converter 42 for receiving a supply voltage Vdd is composed of an amplifier for amplifying a DC component. This DC converter 42 performs DC conversion on the amplitude component described above. The DC converter 42 is implemented by a class S amplifier capable of operating at an efficiency of 95% or higher, such as a switching regulator. The output voltage of the DC converter 42 is provided as a supply voltage to a saturation amplifier 44.

In the other branch, the modulated wave is inputted to a limiter (amplitude limiting amplifier) 43, and thereby undergoes amplitude limitation. As a result, a modulated wave having solely phase information is obtained from the limiter 43. The modulated wave having phase information is inputted to an RF input terminal of the saturation amplifier 44, and thereby modulates the gate voltage of a field effect transistor or the like constituting the saturation amplifier 44. As a result, a modulated wave is outputted from an output terminal 45 provided in the saturation amplifier 44.

The saturation amplifier generically indicates an amplifier used in a state that a change in the output power is no longer caused by a change in the input power, or alternatively immediately below this state. Such an amplifier operates at the theoretical maximum efficiency for the operation class.

As described above, the EER method can employ a saturation amplifier having a high efficiency. This improves the efficiency in the high frequency power amplifier section.

Nevertheless, such a saturation amplifier shows nonlinear response to an amplitude component provided as a supply voltage, as well as to a phase component inputted as a modulated wave. This causes the necessity of a distortion compensation circuit for precisely canceling out the nonlinear response.

SUMMARY OF THE INVENTION

An object of the invention is to provide a transmitter, a transceiver, and a high frequency power amplifier capable of canceling out the distortion of a high frequency power amplifier in the EER method, and thereby permitting the formation of a transmission signal of high quality.

A transmitter according to a first aspect of the invention comprises: a high frequency power amplifier; modulation signal generating means for generating a modulation signal; distortion compensation arithmetic processing means for performing on the modulation signal, in advance, arithmetic processing for canceling out nonlinear distortion to be caused by the high frequency power amplifier; amplitude extracting means for extracting an amplitude component from an arithmetically operated signal outputted from the distortion compensation arithmetic processing means; and DC converting means for performing DC conversion on the amplitude component extracted by the amplitude extracting means. Then, the arithmetically operated signal outputted from the distortion compensation arithmetic processing means is inputted to a high frequency input terminal of the high frequency power amplifier, while the amplitude component having undergone the DC conversion in the DC converting means is inputted to a power supply terminal of the high frequency power amplifier so that a modulated wave is outputted from the high frequency power amplifier.

According to this configuration, the distortion compensation arithmetic processing means is provided for performing on the modulation signal, in advance, arithmetic processing for canceling out nonlinear distortion caused by the high frequency power amplifier. This permits the canceling-out of the distortion of the high frequency power amplifier in the EER method, and hence permits the formation of a transmission signal of high quality.

In the transmitter of the first aspect of the invention, for example, the distortion compensation arithmetic processing means comprises: storing means for storing written-in data of a correction function $y=g(x)$ which has been generated by converting into a complex voltage vector y a result of response of an output power to an input power in the high frequency power amplifier when a voltage x is provided to the power supply terminal of the high frequency power amplifier, and by establishing correspondence between the voltage x and the complex voltage vector y; and $g^{-1}(y)$ operating means for receiving the modulation signal and the correction function $g(x)$, then calculating an inverse function $g^{-1}(y)$ of the correction function $g(x)$ by arithmetic operation, then causing the inverse function $g^{-1}(y)$ to operate on the modulation signal, and thereby outputting the arithmetically operated signal.

This storing means stores a correction function $y=g(x)$ corresponding to the distortion of the high frequency power amplifier as a function of a voltage x provided to the power supply terminal of the high frequency power amplifier.

According to this configuration, distortion characteristics is evaluated for the individual high frequency power amplifier built into a transmitter having the above-mentioned configuration. Then, the correction function $g(x)$ for the individual amplifier obtained as a result of the evaluation is written into the storing means. This avoids that an individual variation in the high frequency power amplifier affects the precision of distortion correction.

Alternatively, in the transmitter of the first aspect of the invention, the distortion compensation arithmetic processing means may comprise: storing means for storing written-in data of an inverse function $g^{-1}(y)$ of a correction function $y=g(x)$ which has been generated by converting into a complex voltage vector y a result of response of an output power to an input power in the high frequency power amplifier when a voltage x is provided to the power supply terminal of the high frequency power amplifier, and by establishing correspondence between the voltage x and the complex voltage vector y; and $g^{-1}(y)$ operating means for receiving the modulation signal and the inverse function $g^{-1}(y)$, then causing the inverse function $g^{-1}(y)$ to operate on the modulation signal, and thereby outputting the arithmetically operated signal.

According to this configuration, distortion characteristics is evaluated for the individual high frequency power amplifier built into a transmitter having the above-mentioned configuration. Then, the inverse function $g^{-1}(y)$ of the correction function $g(x)$ for the individual amplifier obtained as a result of the evaluation is written into the storing means. This avoids that an individual variation in the high frequency power amplifier affects the precision of distortion correction.

In such a configuration that the distortion compensation arithmetic processing means comprises the storing means and the $g^{-1}(y)$ operating means as described above, it is preferable that the transmitter further comprises: periodic function signal generating means for generating a periodic function signal specified by a periodic function an amplitude component of which is at least equal to or greater than an amplitude component of the modulation signal; and first signal switching means which is provided between the $g^{-1}(y)$ operating means and a group including the amplitude extracting means and the high frequency power amplifier, and which receives the arithmetically operated signal, the periodic function signal, and a switching signal, and thereby selects outputting of either the arithmetically operated signal or the periodic function signal in response to the switching signal.

According to this configuration, the periodic function signal generating means is built in for generating a signal specified by a periodic function the amplitude component of which is at least equal to or greater than the amplitude component of the modulation signal. This avoids the necessity of adding, to this configuration, extra means for providing a signal to the high frequency power amplifier in order to evaluate the distortion characteristics of the high frequency power amplifier. This simplifies the configuration necessary for evaluating the distortion characteristics. Further, when a periodic function is adopted as a signal used in the evaluation of the distortion characteristics of the high frequency power amplifier, the averaging of the correction function $g(x)$ becomes easy. This realizes a precise correction function $g(x)$. Further, the first signal switching means for selecting either the signal provided from the periodic function generating means or the signal provided from the modulation signal generating means simplifies the switching into the modulation signal. As such, the invention realizes a precise EER method.

The periodic function described above has preferably a time independent phase.

According to this configuration, the phase of the periodic function is time independent. This simplifies the tracking of the trajectory of the response, and hence simplifies the averaging process.

Further, the speed that the periodic function varies from a minimum to a maximum is preferably the same as the speed that the periodic function varies from a maximum to a minimum.

This configuration ensures that the sample size is the same in a trajectory moving toward a maximum amplitude and in a trajectory moving toward a minimum amplitude. This simplifies the tracking of the trajectory of the complex voltage vector outputted from the high frequency power amplifier.

A transceiver according to a second aspect of the invention comprises: a transmitter described above; attenuating means for attenuating an output power intensity of the transmitter into a value within an input dynamic range of a reception front end; demodulating means for receiving a modulated wave of the transmitter attenuated by the attenuating means, and then demodulating the modulated wave; second signal switching means which is provided in an output of the demodulating means, and which switches an output signal of the demodulating means into any one of two or more paths; and averaging calculation means which is connected to a path selected by the second signal switching means when the first signal switching means selects a signal of the periodic function generating means, and which averages an inputted periodic function signal for at least two or more cycles. Then, a calculation result of the averaging calculation means is outputted to the storing means.

According to this configuration, the periodic function signal generating means is built in for generating a signal specified by a periodic function the amplitude component of which is at least equal to or greater than the amplitude component of the modulation signal. This avoids the necessity of adding, to this configuration, extra means for providing a signal to the high frequency power amplifier in order to evaluate the distortion characteristics of the high frequency power amplifier. Further, a receiver built into the transceiver performs demodulation. Thus, the configuration necessary for evaluating the distortion characteristics is simplified further in comparison with the first aspect of the invention.

Further, distortion characteristics is evaluated for the individual high frequency power amplifier built into a transceiver having the above-mentioned configuration. Then, the correction function $g(x)$ for the individual amplifier or alternatively its inverse function $g^{-1}(y)$ is written into the storing means. This avoids that an individual variation in the high frequency power amplifier affects the precision of distortion correction. Furthermore, the averaging calculation means is provided for averaging the demodulated periodic function signal. Thus, the demodulated periodic function signal is averaged using a set-up period. This improves the accuracy in the demodulated complex voltage vector. Further, when a periodic function is adopted as a signal used in the evaluation of the distortion characteristics of the high frequency power amplifier, the averaging of the demodulated complex voltage vector becomes easy. This realizes a precise correction function $g(x)$. Further, the signal switching means for selecting either the signal provided from the periodic function generating means or the signal provided from the modulation signal generating means simplifies the switching into the modulation signal. As such, the invention realizes a precise EER method.

A high frequency power amplifier according to a third aspect of the invention comprises in a built-in manner: periodic function signal storing means for storing a periodic function signal specified by a periodic function an amplitude component of which is at least equal to or greater than an amplitude component of a modulation signal serving as an object of amplification; and an interface for outputting the periodic function signal to the outside.

According to this configuration, the periodic function signal storing means for storing a periodic function signal is built into the high frequency power amplifier. This simplifies the configuration of the transmitter. Further, in case that the transmitter has in advance a correction signal not composed of a periodic function, precise correction is not achieved in that intact state. However, when the periodic function signal storing means for storing a periodic function signal is built into the high frequency power amplifier, the correction can be performed using the periodic function signal. This permits precise distortion compensation.

A high frequency power amplifier according to a fourth aspect of the invention comprises in a built-in manner: storing means for storing written-in data of a correction function $y=g(x)$ or an inverse function $x=g^{-1}(y)$ thereof, the correction function being generated by converting into a complex voltage vector y a result of response of an output power to an input power when a voltage x is provided to a power supply terminal, and by establishing correspondence between the voltage x and the complex voltage vector y; and an interface for outputting data of the correction function $y=g(x)$ or the inverse function $x=g^{-1}(y)$ thereof to the outside.

According to this configuration, the configuration is simplified in the transmitter. Further, this avoids the necessity of the step of calculating the correction function, hence reduces the number of inspection and shipment steps, and thereby reduces the cost.

A high frequency power amplifier according to a fifth aspect of the invention is characterized in that a package is provided with storing means for storing a correction function $y=g(x)$ or an inverse function $x=g^{-1}(y)$ thereof, the correction function being generated by converting into a complex voltage vector y a result of response of an output power to an input power of the high frequency power amplifier when a voltage x is provided to a power supply terminal, and by establishing correspondence between the voltage x and the complex voltage vector y. This storing means is composed of a bar code, an RF tag, or the like.

According to this configuration, in comparison with the high frequency power amplifier of the fourth aspect of the invention, the number of pins in the package of the high frequency power amplifier is reduced. This reduces the package cost, and hence reduces the overall cost of the high frequency power amplifier. Further, this avoids the necessity of the step of calculating the correction function $g(x)$, hence reduces the number of inspection and shipment steps, and thereby reduces the cost.

Further, when an RF tag is used as the storing means, a large distance is permitted to intervene between the RF tag and an RF tag reader. This improves the workability in the inspection.

As described above in detail, according to the invention, the distortion of a high frequency power amplifier in the EER method can be canceled out precisely so that a transmission signal of high quality is formed.

DESCRIPTION OF THE PREFERRED EMBODIMENTS

Embodiments of the invention are described below with reference to the drawings.

Embodiment 1

Embodiment 1 of the invention is described below with reference to the drawings.

Figure 1:
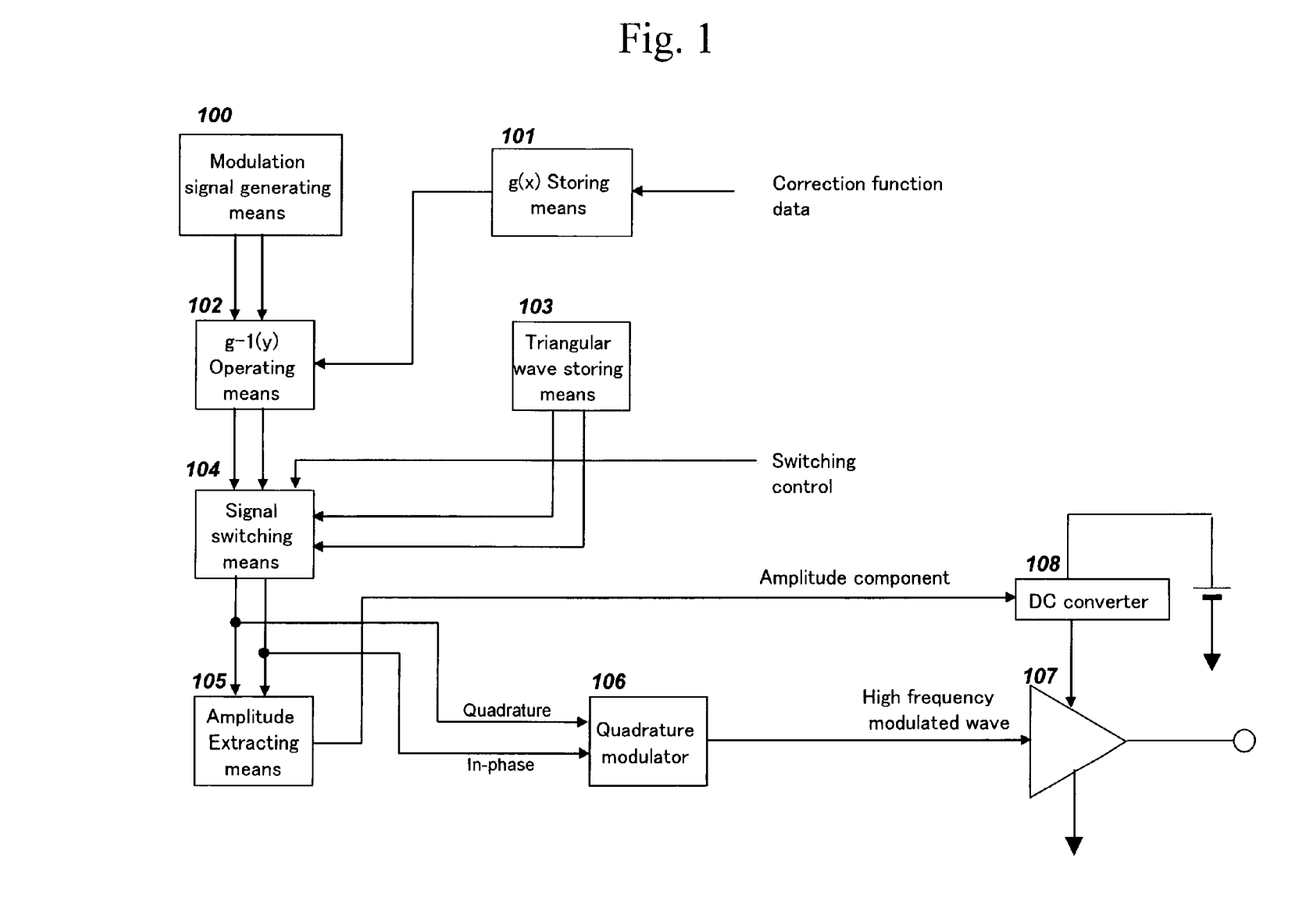
FIG. 1 is a block diagram showing the configuration of a transmitter according to Embodiment 1 of the invention.

FIG. 1 is a circuit diagram of a transmitter capable of achieving a precise EER method according to Embodiment 1 of the invention. As shown in FIG. 1, the transmitter comprises, modulation signal generating means 100, $g(x)$ storing means 101, $g^{-1}(y)$ operating means 102, triangular wave storing means 103, signal switching means 104, amplitude extracting means 105, a quadrature modulator 106, a high frequency power amplifier 107, and a DC converter 108.

The $g(x)$ storing means 101 stores written-in data of a correction function $y=g(x)$ generated by converting in to a complex voltage vector y the result of response of the output power to the input power of the high frequency power amplifier 107 when a voltage x is provided to the drain or the collector power supply terminal of the high frequency power amplifier 107 composed of a field-effect transistor, a bipolar transistor, or the like, and by establishing correspondence between the voltage x and the complex voltage vector y.

The $g^{-1}(y)$ operating means 102 receives the correction function $g(x)$ and the complex vector modulation signal z provided from the modulation signal generating means 100, then causes the inverse function $g^{-1}$ to operate on the absolute value and the phase of a complex vector modulation signal z having undergone polar coordinate conversion, and thereby outputs the result.

The triangular wave storing means 103 stores a triangular wave which is a periodic function having the same amplitude as that of a modulation signal.

The signal switching means 104 selects either a triangular wave signal outputted from the triangular wave storing means 103 or a modulation signal z' (arithmetically operated signal, hereafter) having undergone the operation of the inverse function $g^{-1}$ in the $g^{-1}(y)$ operating means 102.

The amplitude extracting means 105 extracts an amplitude component from the triangular wave signal or the arithmetically operated signal outputted from the signal switching means 104.

The quadrature modulator 106 performs quadrature modulation on the triangular wave signal or the arithmetically operated signal outputted from the signal switching means 104, and thereby performs frequency conversion into a desired frequency.

The operating point and the impedance of the high frequency power amplifier 107 are adjusted into a saturation type.

The DC converter 108 provides the amplitude component of the triangular wave signal or the arithmetically operated signal to the drain or the collector power supply terminal of the high frequency power amplifier 107.

As a result, a modulated wave signal having undergone power amplification is outputted from the high frequency power amplifier 107.

The operation is described below quantitatively.

When the supply voltage for the high frequency power amplifier 107 is set to be 7 V, the amplitude component of the modulation signal provided to the high frequency power amplifier 107 is preferably scaled into the range of 0 V through 7 V so that the dynamic range of the high frequency power amplifier 107 should be used completely. At that time, in order that the distortion of the high frequency power amplifier 107 should be compensated appropriately, the triangular wave signal needs to operate at an amplitude the same as or larger than that of the modulation signal. The configuration of the DC converter need not be changed in distortion compensation and in normal communication. Thus, the amplitude of the triangular wave signal may be the same as that of the modulation signal.

The signal switching means 104 receives a signal of HIGH (5 V) or LOW (0 V). Then, for example, when the signal is HIGH, the signal switching means 104 outputs an OFDM (Orthogonal Frequency Division Multiplex) signal. When the signal is LOW, the signal switching means 104 outputs a triangular wave signal. The amplitude extracting means 105 calculates the absolute value of the complex vector signal x of the modulation signal or the triangular wave signal, then performs DA conversion on the data, and then outputs the signal through an anti-aliasing filter to the DC converter 108. At that time, an appropriate offset voltage may be provided.

At the same time, the signal outputted from the signal switching means 104 undergoes DA conversion, then goes through an anti-aliasing filter pass and then is outputted as I (In-Phase) and Q (Quadrature) signal components to the quadrature modulator 106. At that time, the timing of the amplitude component and the I and Q signal components need to be adjusted such that the modulation precision should be maximized or that the adjacent channel leakage power (ratio) of the high frequency power amplifier 107 should be minimized.

For example, when the DA converter outputs at an LVCMOS level (approximately 1 V), the DC converter 108 amplifies the output voltage of the DA converter by means of operational amplifiers connected in two stages, and thereby amplifies the output voltage of the DA converter into 7 V at maximum. The amplified signal undergoes DC conversion in an emitter follower or the like, and then drives the high frequency power amplifier 108 at a necessary current.

The high frequency power amplifier 108 is an amplifier of saturation type, and is set to operate in class B, F, E, or the like.

Figure 2:
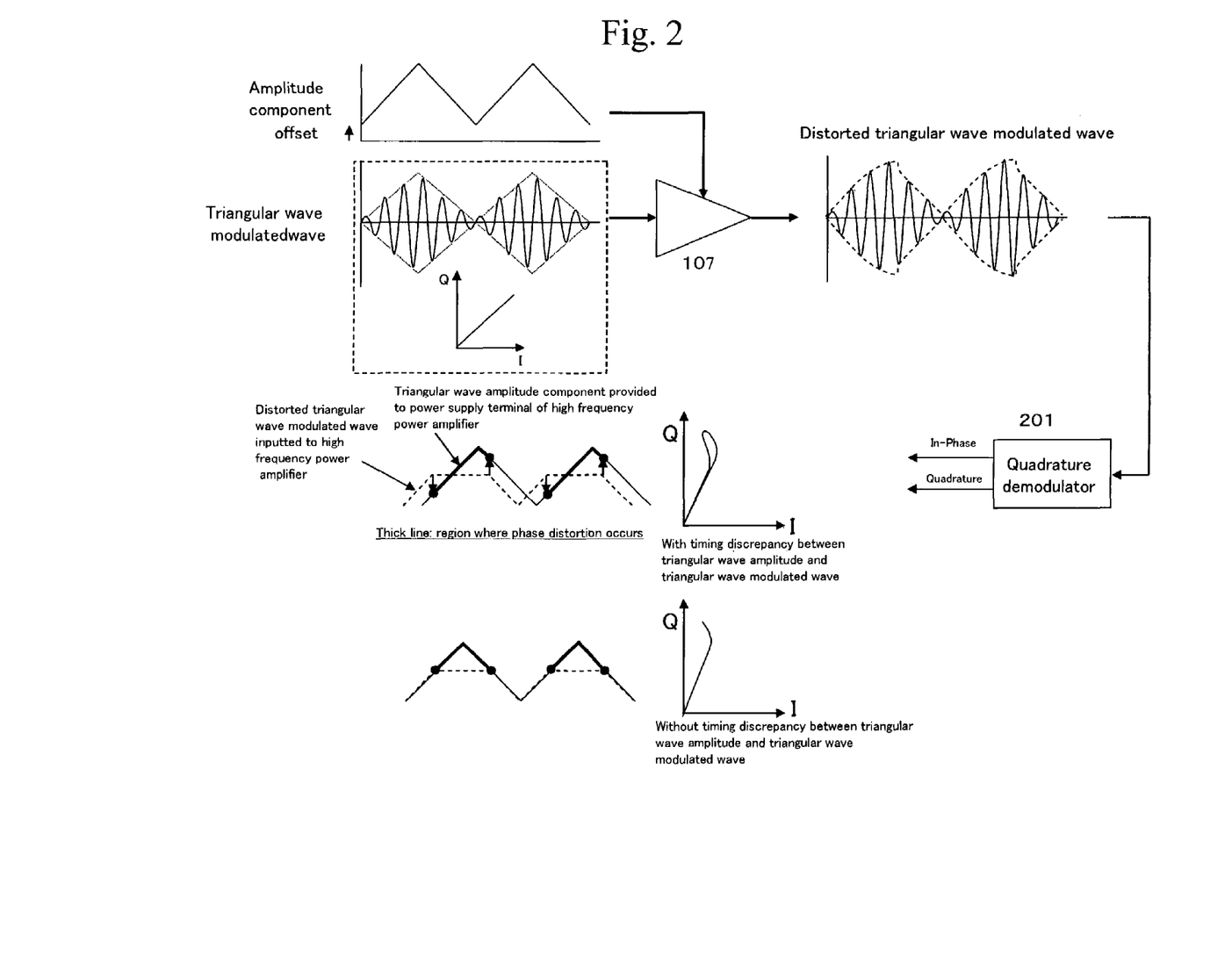
FIG. 2 is a schematic diagram showing the situation of correction in a transmitter according to Embodiment 1 of the invention.

FIG. 2 quantitatively shows the input signals and the output signal of the high frequency power amplifier 107 in the case that a triangular wave signal is inputted. The complex voltage vector of the triangular wave signal is a signal which varies linearly with the same time period. For example, when the I component and the Q component have the same amplitude on the complex plane, the signal is represented as of a 45° fixed phase line as shown in the figure. This signal undergoes frequency modulation in the quadrature modulator 106 so that a modulated wave is generated.

In the high frequency power amplifier 107, as shown in FIG. 2, a triangular wave modulated wave is inputted to its high frequency signal input terminal, while the amplitude component of the triangular wave signal having an offset is inputted to the power supply terminal. The modulated wave output obtained from the high frequency power amplifier 107 is affected by the distortion of the high frequency power amplifier 107, and thereby rounded as illustrated in the figure. In this waveform, the phase is advanced in high amplitude components.

This waveform is demodulated by a quadrature demodulator 201 so that a complex voltage vector y is obtained. At that time, even a small frequency discrepancy between the demodulator and the modulation can prevent their synchronization. Thus, a reference oscillator needs to be used commonly. The sampling size of complex voltage vector y is set to be a time duration which is at least two or more cycles of the inputted triangular wave signal. Then, the complex voltage vector y is averaged over the number of sampled cycles. FIG. 2 shows the mapping of the averaged complex voltage vector y onto the I-Q coordinates. FIG. 2 shows two cases that a timing discrepancy is present between the amplitude component of the triangular wave and the triangular wave modulated wave, and that no timing discrepancy is present. As a result of the distortion of the high frequency power amplifier 107, the amplitude suffers compression in the region of larger amplitudes, so that the phase is rotating.

As a result of the operation described above, a complex voltage vector y is obtained that suffers from the distortion of the high frequency power amplifier 107. When correspondence is established between this data and the amplitude component x of the original triangular wave signal, a table of a correction function g(x) is obtained that includes three components: the amplitude component x, the absolute value |y|, and the phase ∠y. The phase ∠y may be converted into a rectangular coordinate value.

The effect of using the triangular wave signal is described below with reference to FIG. 2. FIG. 2 shows the complex voltage vector y in the two cases that a timing discrepancy is present between the triangular wave modulated wave and the triangular wave amplitude, and that no timing discrepancy is present. For example, when the timing of the amplitude component is delayed as shown in the figure, the amplitude region that suffers phase distortion becomes asymmetric such as to deviate toward the amplitude increasing side relative to the maximum amplitude. Thus, the trajectory moves circularly on the I-Q coordinates. When such a result is averaged, a large error is included in the data in the distorted region. Accordingly, the timing between the amplitude component of the triangular wave and the triangular wave modulated wave component needs to be adjusted into synchronization such that the trajectory having moved circularly should be closed and that. Along the trajectory where the timing is adjusted, the averaging process is achieved precisely. As a result, a precise correction function g(x) is obtained.

For example, as in a sawtooth wave, when the time necessary for reaching the amplitude maximum is different from that necessary for reaching the amplitude minimum, the sample size in the shorter time becomes smaller. Thus, a circular trajectory as obtained in the case of a timing discrepancy in the triangular wave becomes difficult to be detected. In other words, a periodic function such as the triangular wave where the time necessary for reaching the amplitude maximum is equal to that necessary for reaching the amplitude minimum is advantageous in obtaining the correction function.

The correction function g(x) is inputted to the g(x) storing means 101 via a serial interface or the like. The g(x) storing means 101 is composed of a flash memory or the like. Thus, the stored correction function g(x) is retained even after the power is turned OFF.

The correction function g(x) stored in the g(x) storing means 101 is transformed into its inverse function $g^{-1}(y)$ by the $g^{-1}(y)$ operating means 102. In an example of the process of obtaining the inverse function $g^{-1}(y)$, linear interpolation is performed by the $g^{-1}(y)$ operating means 102 such that the data of |y| should distribute at constant intervals. Then, x and ∠y corresponding to the |y| distributing at constant intervals are calculated by linear interpolation. In the $g^{-1}(y)$ operating means 102, the input is caused to correspond to |y|, while the output caused to correspond to x and −∠y. As a result, the correction function g(x) is converted into an inverse function $g^{-1}(y)$.

As such, in the $g^{-1}(y)$ operating means 102, the inputted modulation signal z is converted into to the amplitude |z| and the phase angle ∠z by polar coordinate conversion. Then, when |z| is inputted, a complex vector z' corrected with $g^{-1}(z)$ is obtained.

In the above, description has been given for the method of obtaining the correction function and the method of causing the inverse function of the correction function to operate on the modulation signal.

When communication is performed, the switching signal for the signal switching means 104 is first set to be LOW so that the modulation signal z' having undergone the distortion compensation in the $g^{-1}(y)$ operating means 102 is outputted. This modulation signal z' is further outputted through a DA converter (not shown) to the quadrature modulator 106 and the amplitude extracting means 105. In the amplitude extracting means 105, the amplitude component of the modulation signal z' having undergone the distortion compensation is obtained by arithmetic operation. Then, the amplitude component of modulation signal z' having undergone the distortion compensation is outputted through a DA converter (not shown) to the DC converter 108.

The modulated wave and the amplitude component having undergone the distortion compensation and inputted to the high frequency power amplification 107 suffer distortion g in the high frequency power amplifier. Then, as a result of the operation $g(z'=g^{-1}(z))=z$, a distortion-free signal is reconstructed in the output of the high frequency power amplifier 107. That is, the distortion-free modulated wave and amplitude component are multiplied with each other in the output of the high frequency power amplifier 107 so that a precise modulated wave is reconstructed.

According to the present embodiment, the triangular wave storing means 103 is built in for generating a triangular wave signal the amplitude component of which is at least equal to or greater than the amplitude component of the modulation signal. This avoids the necessity of adding, to this configuration, extra means for providing a signal to the high frequency power amplifier in order to evaluate the distortion characteristics of the high frequency power amplifier. This simplifies the configuration necessary for evaluating the distortion characteristics. Further, distortion characteristics is evaluated for the individual high frequency power amplifier built into a transmitter having the above-mentioned configuration. Then, the correction function g(x) for the individual amplifier is written into the g(x) storing means 101. This avoids that an individual variation in the high frequency power amplifier affects the precision of distortion correction. Further, when a periodic function is adopted as a signal used in the evaluation of the distortion characteristics of the high frequency power amplifier, the averaging of the response of the correction function g(x) to an input x becomes easy. This realizes a precise correction function g(x). Further, the signal switching means 104 for selecting either the signal provided from the triangular wave storing means l03 or the signal provided from the modulation signal generating means 100 simplifies the switching into the modulation signal.

Further, the phase of the triangular wave function is time independent. This simplifies the tracking of the trajectory of the response, and hence simplifies the averaging process.

Further, this configuration ensures that the sample size is the same in a trajectory moving toward a maximum amplitude and in a trajectory moving toward a minimum amplitude. This simplifies the tracking of the trajectory of the complex voltage vector outputted from the high frequency power amplifier.

As described above, according to the present embodiment, in a transmitter employing the EER method, the distortion of the high frequency power amplifier is compensated precisely so that a modulated transmission wave of high quality is obtained.

In the present embodiment, the inverse function $x=g^{-1}(y)$ in place of the correction function y=g(x) may be written into and stored in the g(x) storing means 101. This avoids the necessity of the step of calculating the inverse function, hence reduces the number of inspection and shipment steps, and thereby reduces the cost further.

In addition, the triangular wave storing means and the signal switching means may be omitted.

Embodiment 2

Embodiment 2 of the invention is described below with reference to the drawings.

Figure 3:
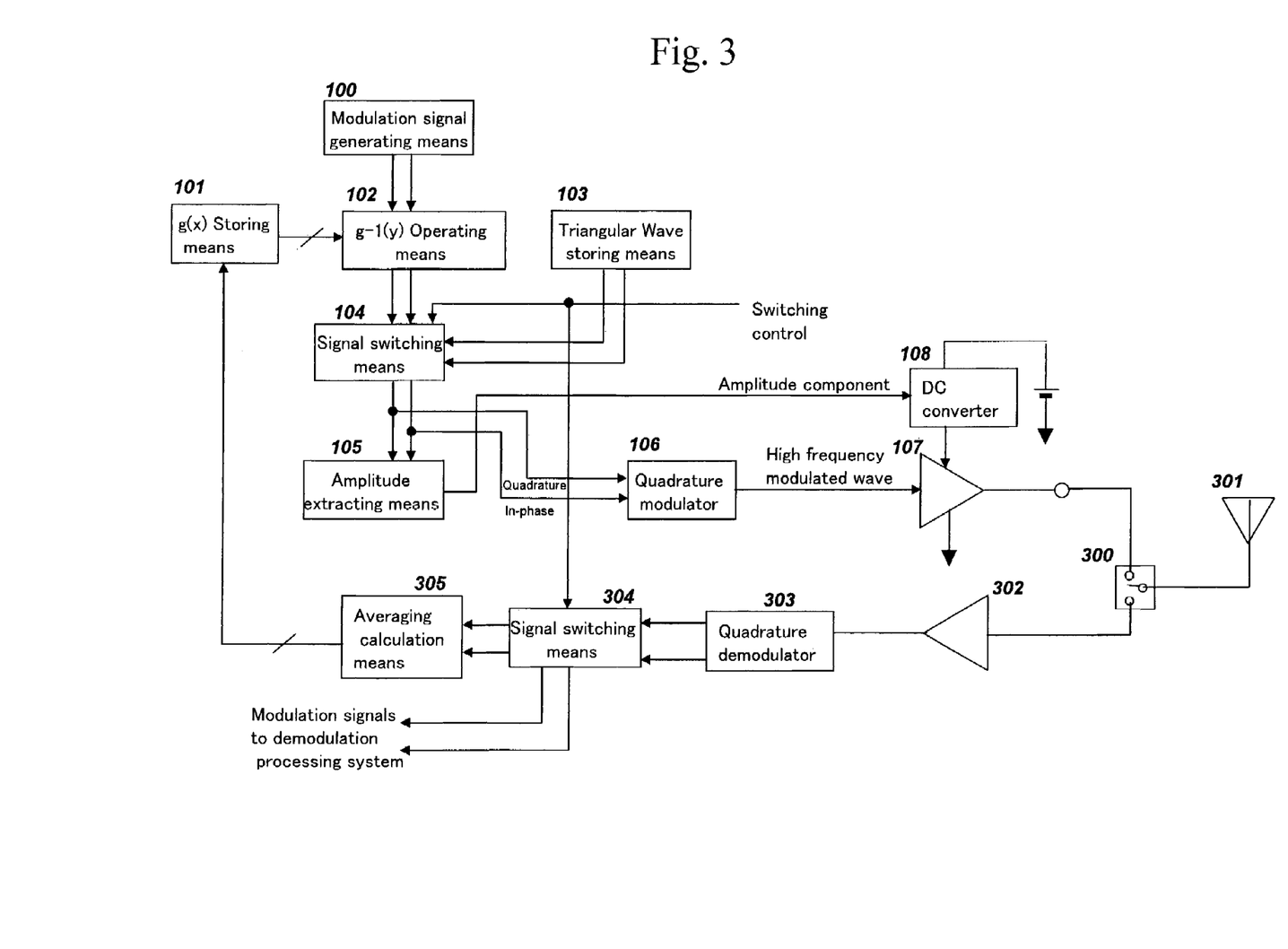
FIG. 3 is a block diagram showing the configuration of a transceiver according to Embodiment 2 of the invention.

FIG. 3 is a circuit diagram of a transceiver capable of performing a precise EER method according to Embodiment 2 of the invention. This embodiment employs the above-mentioned configuration of a transmitter according to Embodiment 1. Thus, the functional operation of the transmitter part is the same as described above, and hence its description is omitted here. Further, like components are designated by like numerals.

Newly added components are a transmission/reception selector switch 300, an antenna 301, a low noise amplifier 302, a quadrature demodulator 303, signal switching means 304, and averaging calculation means 305.

The operation in the present embodiment is described below.

This configuration is expected to employ a time domain duplex (TDD) transceiver. As described above in Embodiment 1, when the transmitter performs distortion compensation for the high frequency power amplifier 107, the signal switching means 104 selects a triangular wave signal. As a result, a triangular wave modulated wave including distortion is outputted from the high frequency power amplifier 107.

The transmission/reception selector switch 300 selects, for example, the reception side during this operation. As a result, transmission is separated from reception by the isolation characteristics of the transmission/reception selector switch 300. For example, when the isolation between the reception port and the transmission port of the transmission/reception selector switch 300 is 30 dB, and when the isolation between the input and the output of the low noise amplifier 302 is 30 dB or the like in the case that the power supply for the low noise amplifier 302 is OFF, attenuating means of 60 dB in total is present in the upstream of the quadrature demodulator 303.

Then, when the mean power of the triangular wave modulated wave outputted from the high frequency power amplifier 107 is 15 dBm, a mean power of −45 dBm is inputted to the quadrature demodulator 303. This value is within the input dynamic range of the quadrature demodulator 303. Thus, the signal is processed linearly with a sufficient margin. It should be noted that when the level is too low, the noise characteristics of a gain control amplifier in the quadrature demodulator 303 degrades so that the SN ratio of the signal decreases. Thus, a preferable range for the power inputted from the selector switch 300 is −70 dBm through −20 dBm or the like.

The signal switching means 304 switches the two cases that the signal from the quadrature demodulator 303 is a triangular wave modulation signal for correction, and that the signal is not so. When the signal is not a triangular wave modulation signal, that is, during the communication or the like, the modulation signal is transmitted to the demodulation signal processing route. In the case of a triangular wave signal, the path to the averaging calculation means 305 is selected by a HIGH (5 V) signal which is the same logic as in the signal switching means 104.

In the averaging calculation means 305, the demodulated complex voltage vectors is accumulated for at least two or more cycles of the triangular wave signal. Then, averaging is performed over the accumulated cycles. The averaged complex voltage vector is outputted and stored into the g(x) storing means 101.

The configuration of the present embodiment avoids the necessity of an external demodulator (in the form of a measurement instrument or the like) and a calculator (such as a personal computer) for averaging the complex voltage vector which had been necessary in Embodiment 1. This simplifies the configuration, and hence reduces the cost in the inspection and the shipment of the products. Nevertheless, the modulator 106 and the demodulator 303 need to use a common reference oscillator, for example, built into either of them.

According to the present embodiment, the triangular wave storing means 103 is built in for generating a triangular wave signal the amplitude component of which is at least equal to or greater than the amplitude component of the modulation signal. This avoids the necessity of adding, to this configuration, extra means for providing a signal to the high frequency power amplifier in order to evaluate the distortion characteristics of the high frequency power amplifier. Further, demodulation is performed by the receiver built into the transceiver. This simplifies further the configuration necessary for evaluating the distortion characteristics, in comparison with Embodiment 1. Further, distortion characteristics is evaluated for the individual high frequency power amplifier built into a transceiver having the above-mentioned configuration. Then, the correction function g(x) for the individual amplifier is written into the g(x) storing means 101. This avoids that an individual variation in the high frequency power amplifier affects the precision of distortion correction. The averaging calculation means 305 is provided for averaging the demodulated triangular wave signal. Thus, the demodulated triangular wave signal is averaged using a set-up period. This improves the accuracy in the demodulated complex voltage vector. Further, when a periodic function is adopted as a signal used in the evaluation of the distortion characteristics of the high frequency power amplifier, the averaging of the demodulated complex voltage vector becomes easy. This realizes a precise correction function g(x). Further, the signal switching means 104 for selecting either the signal provided from the triangular wave storing means 103 or the signal provided from the modulation signal generating means 100 simplifies the switching into the modulation signal.

Further, the phase of the triangular wave function is time independent. This simplifies the tracking of the trajectory of the response, and hence simplifies the averaging process.

Further, this configuration ensures that the sample size is the same in a trajectory moving toward a maximum amplitude and in a trajectory moving toward a minimum amplitude. This simplifies the tracking of the trajectory of the complex voltage vector outputted from the high frequency power amplifier.

As described above, according to the present embodiment, in a transceiver employing the EER method, the distortion of the high frequency power amplifier is compensated precisely so that a modulated transmission wave of high quality is obtained.

In the present embodiment, the inverse function $x=g^{-1}(y)$ in place of the correction function $y=g(x)$ may be written into and stored in the g(x) storing means 101. This avoids the necessity of the step of calculating the inverse function, hence reduces the number of inspection and shipment steps, and thereby reduces the cost further.

Embodiment 3

Embodiment 3 of the invention is described below with reference to the drawings.

Figure 4:
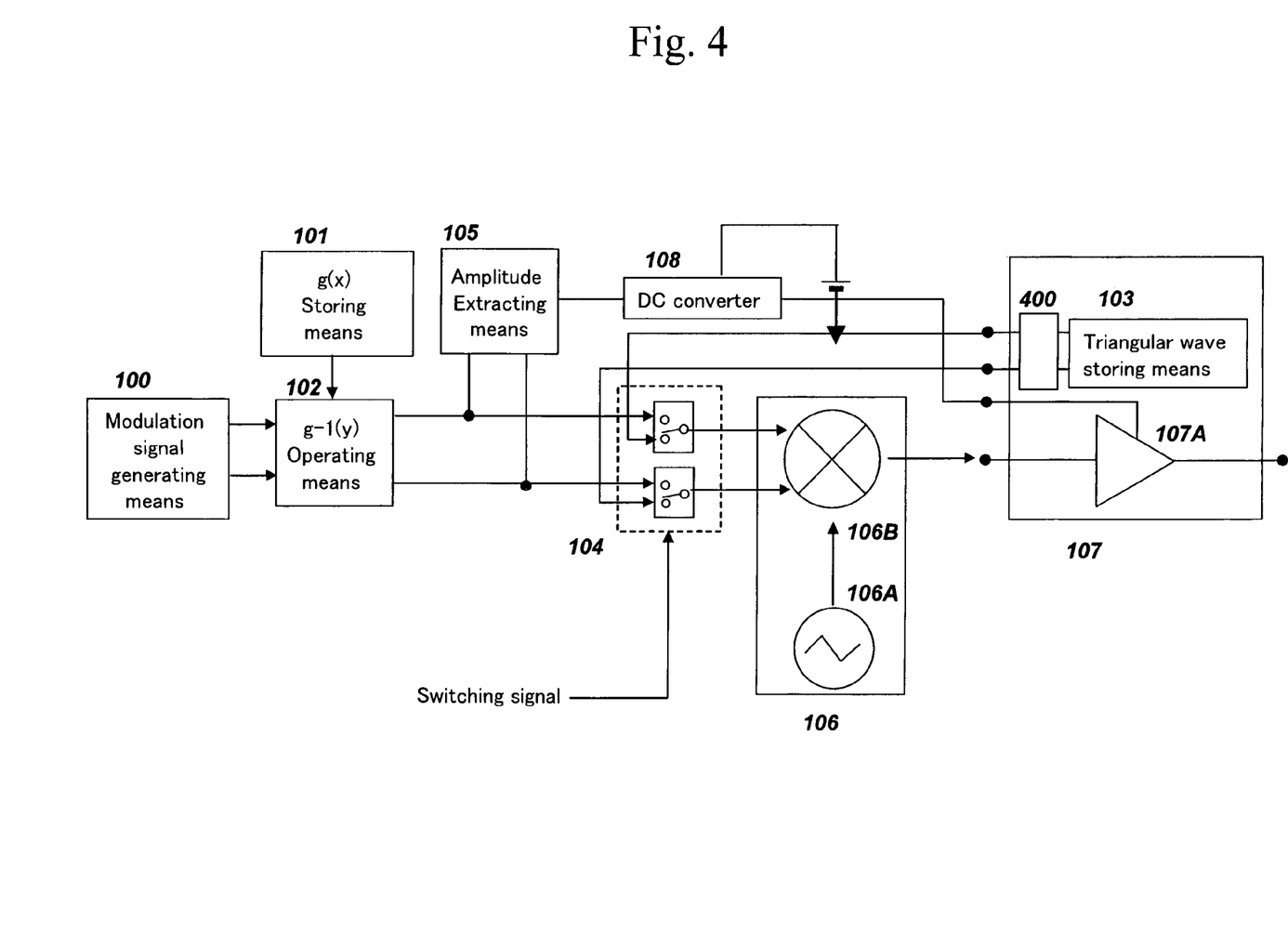
FIG. 4 is a block diagram showing the configuration of a transmitter including a high frequency power amplifier according to Embodiment 3 of the invention.

FIG. 4 is a diagram of a circuit capable of performing a precise EER method using a high frequency power amplifier according to Embodiment 3 of the invention. Like components to Embodiment 1 shown in FIG. 1 are designated by like numerals. In the present embodiment, triangular wave storing means 103 and an interface 400 are built into a high frequency power amplifier 107. The triangular wave storing means 103 built into the high frequency power amplifier 107 outputs a triangular wave signal through the interface 400 to the signal switching means 104. In FIG. 4, numeral 107A indicates the power amplification section which is the main part of the high frequency power amplifier 107. The quadrature modulator 106 is composed of a reference oscillator 106A and a mixer 106B.

This embodiment is effective, for example, in the case that a baseband LSI provided with modulation signal generating means 100, g(x) storing means 101, and $g^{-1}(y)$ operating means 102 in a built-in manner has a correction signal other than a triangular wave. That is, precise distortion correction is not achieved by this baseband LSI solely. However, when the triangular wave storing means 103 is built into the high frequency power amplifier 107, the triangular wave is used for distortion correction. This permits precise distortion compensation.

Embodiment 4

Embodiment 4 of the invention is described below with reference to the drawings.

Figure 5:
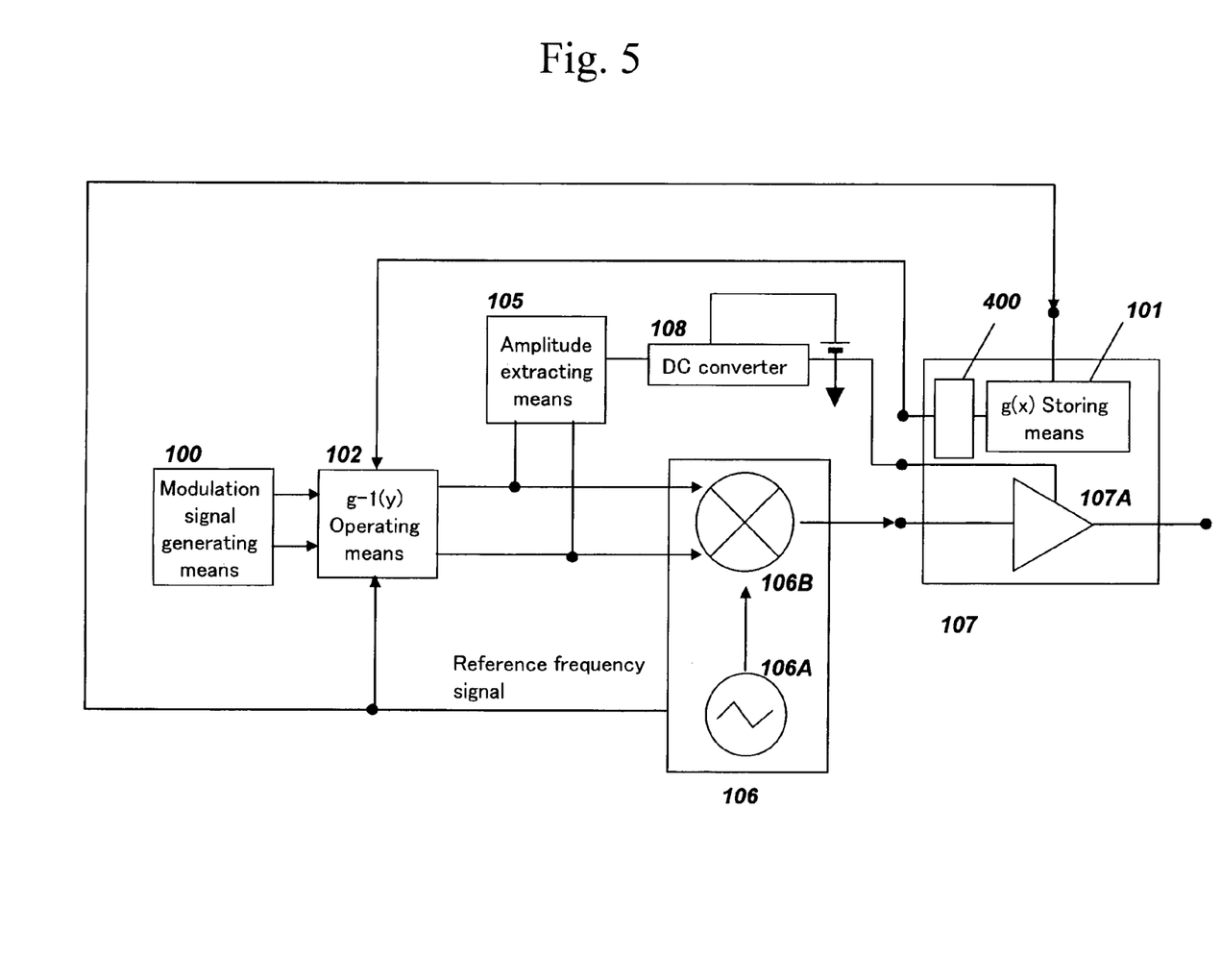
FIG. 5 is a block diagram showing the configuration of a transmitter including a high frequency power amplifier according to Embodiment 4 of the invention.

FIG. 5 is a diagram of a circuit capable of performing a precise EER method using a high frequency power amplifier according to Embodiment 4 of the invention.

Like components to Embodiments 1 and 3 shown in FIGS. 1 and 4 are designated by like numerals. In the present embodiment, g(x) storing means 101 and an interface 400 are built into a high frequency power amplifier 107.

In this embodiment, the built-in g(x) storing means 101 outputs the data of the correction function g(x) through the interface 400 to the $g^{-1}(y)$ operating means 102.

This embodiment simplifies the entire system such as a transmitter. Further, this configuration avoids the necessity of the step of calculating the correction function, hence reduces the number of inspection and shipment steps, and thereby reduces the cost.

The inverse function $x=g^{-1}(y)$ in place of the correction function $y=g(x)$ may be written into and stored in the g(x) storing means 101 built into the high frequency power amplifier 107. This avoids the necessity of the step of calculating the inverse function, hence reduces the number of inspection and shipment steps, and thereby reduces the cost further.

Embodiment 5

Embodiment 5 of the invention is described below with reference to the drawings.

Figure 6:
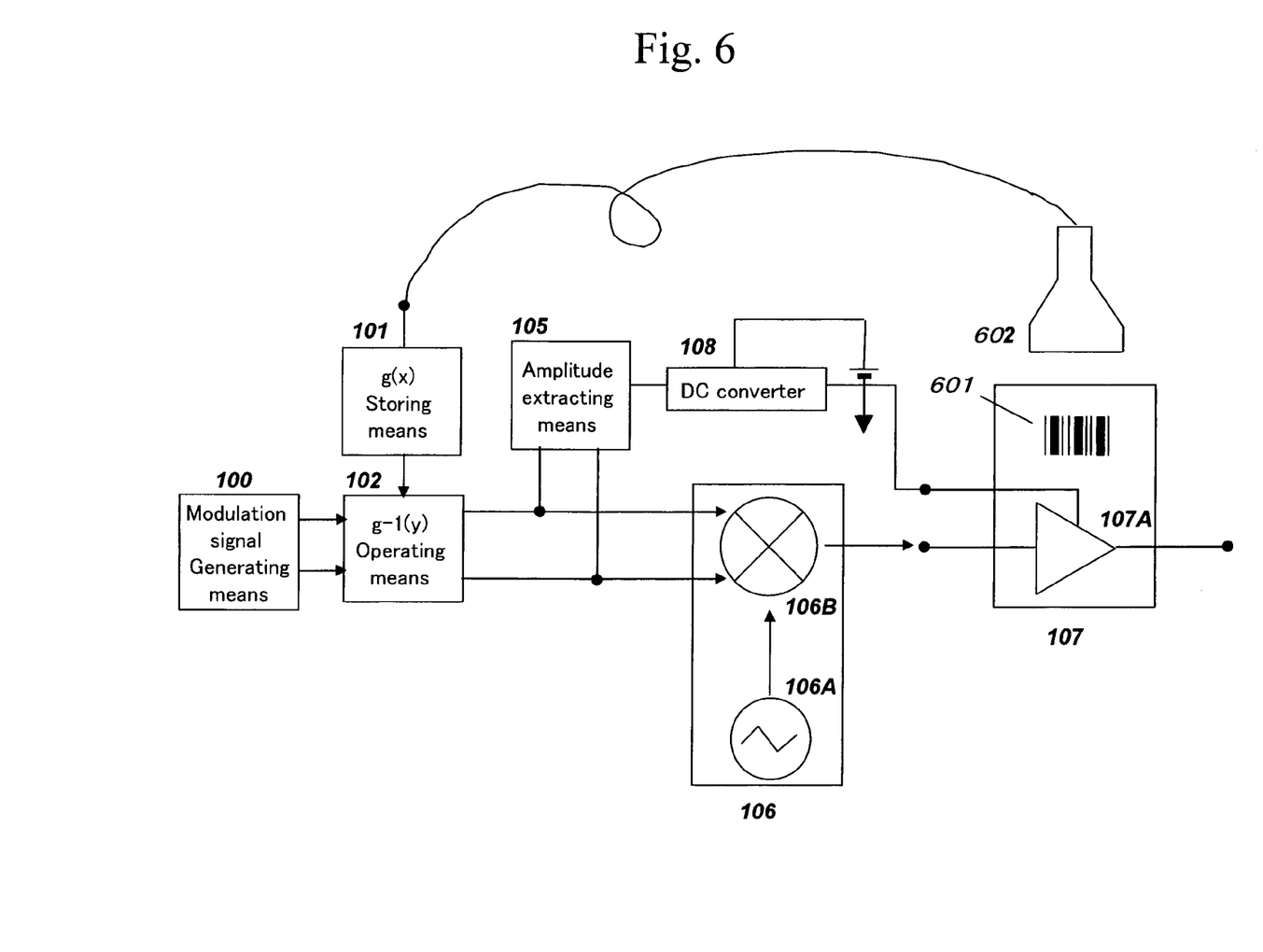
FIG. 6 is a block diagram showing the configuration of a transmitter including a high frequency power amplifier according to Embodiment 5 of the invention.

FIG. 6 is a diagram of a circuit capable of performing a precise EER method using a high frequency power amplifier according to Embodiment 5 of the invention.

Like components to Embodiments 1 and 3 shown in FIGS. 1 and 4 are designated by like numerals. In this embodiment, the data of a correction function g(x) is recorded in a bar code 601 provided in a package of the power amplifier 107. The data of the correction function g(x) recorded in the bar code 601 is read by a bar code reader 602, and then is stored in the g(x) storing means 101.

This embodiment reduces the number of pins provided in the package of the high frequency power amplifier 107 in comparison, example, with the high frequency power amplifier described in Embodiment 4. This reduces the package cost, and hence reduces the overall cost of the high frequency power amplifier 107. Further, this configuration avoids the necessity of the step of calculating the correction function g(x), hence reduces the number of inspection and shipment steps, and thereby reduces the cost.

The inverse function $x=g^{-1}(y)$ in place of the correction function $y=g(x)$ may be written into and stored in the bar code 601. This avoids the necessity of the step of calculating the inverse function, hence reduces the number of inspection and shipment steps, and thereby reduces the cost further.

Embodiment 6

Embodiment 6 of the invention is described below with reference to the drawings.

Figure 7:
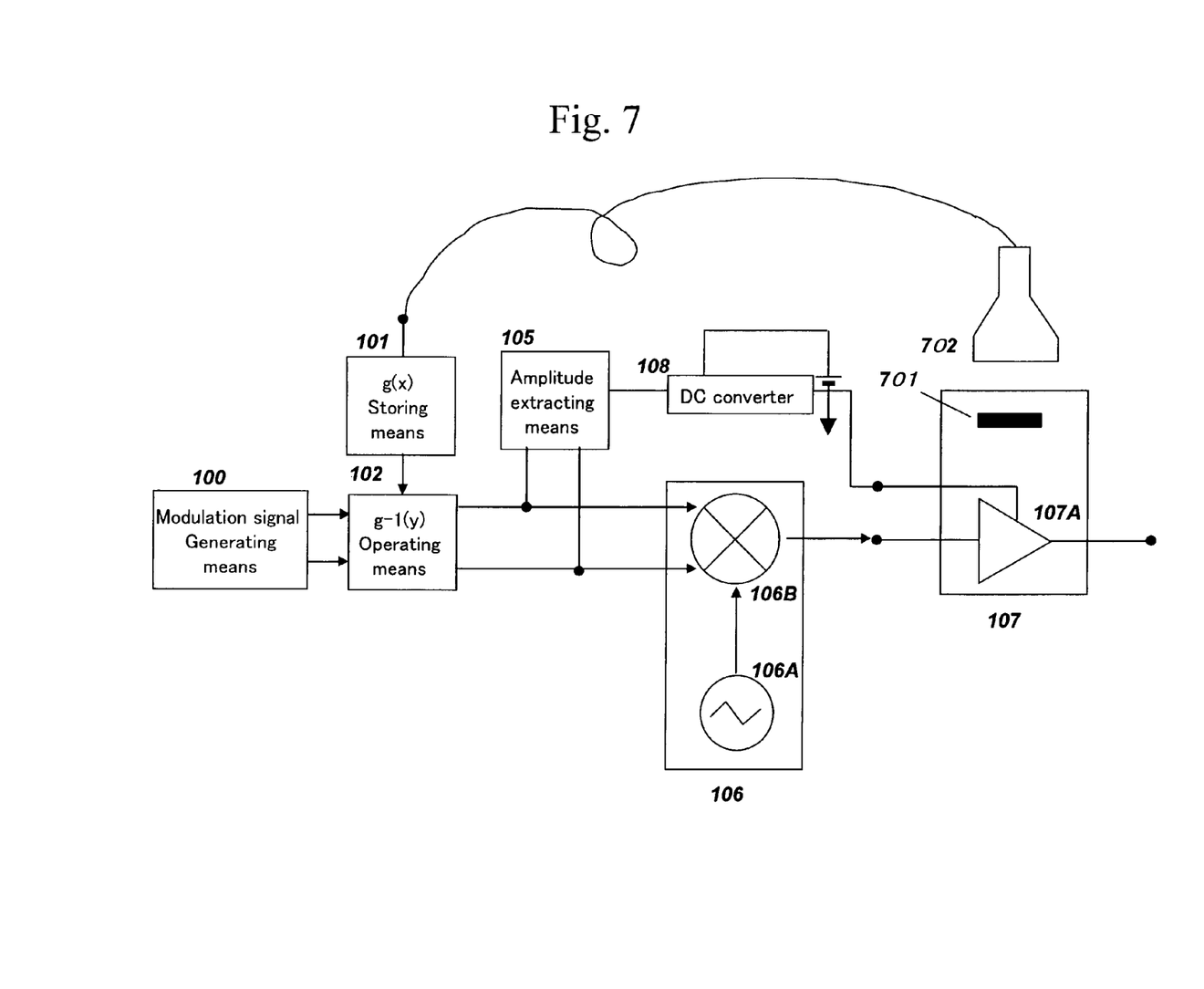
FIG. 7 is a block diagram showing the configuration of a transmitter including a high frequency power amplifier according to Embodiment 6 of the invention.

FIG. 7 is a diagram of a circuit capable of performing a precise EER method using a high frequency power amplifier according to Embodiment 6 of the invention.

Like components to Embodiments 1 and 3 shown in FIGS. 1 and 4 are designated by like numerals. In this embodiment, the data of a correction function g(x) is recorded in an RF tag 701 provided in a package of the power amplifier 107. The data of the correction function g(x) recorded in the RF tag 701 is read by an RF tag reader 702, and then is stored in the g(x) storing means 101.

This embodiment reduces the number of pins provided in the package of the high frequency power amplifier 107 in comparison with the high frequency power amplifier described in Embodiment 4. This reduces the package cost, and hence reduces the overall cost of the high frequency power amplifier 107. Further, a large distance is permitted to intervene between the RF tag 701 and the RF tag reader 702. This improves the workability in the inspection. Further, this configuration avoids the necessity of the step of calculating the correction function, hence reduces the number of inspection and shipment steps, and thereby reduces the inspection cost.

The inverse function $x=g^{-1}(y)$ in place of the correction function $y=g(x)$ may be written into and stored in the RF tag 701. This avoids the necessity of the step of calculating the inverse function, hence reduces the number of inspection and shipment steps, and thereby reduces the cost further.

INDUSTRIAL APPLICABILITY

A transmitter according to the invention achieves precise correction, and hence realizes a precise EER method.

What is claimed is:

1. A transmitter comprising:
a high frequency power amplifier;
modulation signal generating means for generating a modulation signal;
distortion compensation arithmetic processing means for performing on said modulation signal, in advance, arithmetic processing for canceling out nonlinear distortion to be caused by said high frequency power amplifier;
amplitude extracting means for extracting an amplitude component from an arithmetically operated signal outputted from said distortion compensation arithmetic processing means; and
DC converting means for performing DC conversion on the amplitude component extracted by said amplitude extracting means; wherein
the arithmetically operated signal outputted from said distortion compensation arithmetic processing means is inputted to a high frequency input terminal of said high frequency power amplifier, while the amplitude component having undergone the DC conversion in said DC converting means is inputted to a power supply terminal of said high frequency power amplifier so that a modulated wave is outputted from said high frequency power amplifier.

2. A transmitter according to claim 1, wherein said distortion compensation arithmetic processing means comprises:
storing means for storing written-in data of a correction function $y=g(x)$ which has been generated by converting into a complex voltage vector y a result of response of an output power to an input power in said high frequency power amplifier when a voltage x is provided to the power supply terminal of said high frequency power amplifier, and by establishing correspondence between said voltage x and said complex voltage vector y; and
$g^{-1}(y)$ operating means for receiving said modulation signal and said correction function g(x), then calculating an inverse function $g^{-1}(y)$ of said correction function g(x) by arithmetic operation, then causing said inverse function $g^{-1}(y)$ to operate on said modulation signal, and thereby outputting said arithmetically operated signal.

3. A transmitter according to claim 2, further comprising:
periodic function signal generating means for generating a periodic function signal specified by a periodic function an amplitude component of which is at least equal to or greater than an amplitude component of said modulation signal; and
first signal switching means which is provided between said $g^{-1}(y)$ operating means and a group including said amplitude extracting means and said high frequency power amplifier, and which receives said arithmetically operated signal, said periodic function signal, and a switching signal, and thereby selects outputting of either said arithmetically operated signal or said periodic function signal in response to said switching signal.

4. A transmitter according to claim 3, wherein the periodic function has a time independent phase.

5. A transmitter according to claim 4, wherein a speed that the periodic function varies from a minimum to a maximum is the same as a speed that the periodic function varies from a maximum to a minimum.

6. A transceiver comprising:
a transmitter according to claim 3;
attenuating means for attenuating an output power intensity of said transmitter into a value within an input dynamic range of a reception front end;
demodulating means for receiving a modulated wave of said transmitter attenuated by said attenuating means, and then demodulating the modulated wave;
second signal switching means which is provided in an output of said demodulating means, and which switches an output signal of said demodulating means into any one of two or more paths; and
averaging calculation means which is connected to a path selected by said second signal switching means when said first signal switching means selects a signal of said periodic function generating means, and which averages an inputted periodic function signal for at least two or more cycles; whereby a calculation result of said averaging calculation means is outputted to said storing means.

7. A transceiver according to claim 6, wherein the periodic function has a time independent phase.

8. A transceiver according to claim 7, wherein a speed that the periodic function varies from a minimum to a maximum is the same as a speed that the periodic function varies from a maximum to a minimum.

9. A transmitter according to claim 1, wherein said distortion compensation arithmetic processing means comprises:

storing means for storing written-in data of an inverse function $g^{-1}(y)$ of a correction function $y=g(x)$ which has been generated by converting into a complex voltage vector y a result of response of an output power to an input power in said high frequency power amplifier when a voltage x is provided to the power supply terminal of said high frequency power amplifier, and by establishing correspondence between said voltage x and said complex voltage vector y; and $g^{-1}(y)$ operating means for receiving said modulation signal and said inverse function $g^{-1}(y)$, then causing said inverse function $g^{-1}(y)$ to operate on said modulation signal, and thereby outputting said arithmetically operated signal.

10. A transmitter according to claim 3, further comprising:

periodic function signal generating means for generating a periodic function signal specified by a periodic function an amplitude component of which is at least equal to or greater than an amplitude component of said modulation signal; and first signal switching means which is provided between said $g^{-1}(y)$ operating means and a group including said amplitude extracting means and said high frequency power amplifier, and which receives said arithmetically operated signal, said periodic function signal, and a switching signal, and thereby selects outputting of either said arithmetically operated signal or said periodic function signal in response to said switching signal.

11. A transmitter according to claim 10, wherein the periodic function has a time independent phase.

12. A transmitter according to claim 11, wherein a speed that the periodic function varies from a minimum to a maximum is the same as a speed that the periodic function varies from a maximum to a minimum.

13. A transceiver comprising:

a transmitter according to claim 10;

attenuating means for attenuating an output power intensity of said transmitter into a value within an input dynamic range of a reception front end;

demodulating means for receiving a modulated wave of said transmitter attenuated by said attenuating means, and then demodulating the modulated wave;

second signal switching means which is provided in an output of said demodulating means, and which switches an output signal of said demodulating means into any one of two or more paths; and averaging calculation means which is connected to a path selected by said second signal switching means when said first signal switching means selects a signal of said periodic function generating means, and which averages an inputted periodic function signal for at least two or more cycles; whereby a calculation result of said averaging calculation means is outputted to said storing means.

14. A transceiver according to claim 13, wherein the periodic function has a time independent phase.

15. A transceiver according to claim 14, wherein a speed that the periodic function varies from a minimum to a maximum is the same as a speed that the periodic function varies from a maximum to a minimum.

* * * * *